US010338551B2

(12) United States Patent
Jirkovský et al.

(10) Patent No.: US 10,338,551 B2
(45) Date of Patent: Jul. 2, 2019

(54) P AND ID AND CONTROL SYSTEM SYNCHRONIZATION

(71) Applicant: Rockwell Automation Technologies, Inc., Mayfield Heights, OH (US)

(72) Inventors: Václav Jirkovský, Prague (CZ); Marek Obitko, Kladno (CZ); Robert Mavrov, Prague (CZ); Alexander B. Cherpakov, Mayfield Heights, OH (US); Anthony C. Barrancotta, Alliance, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 415 days.

(21) Appl. No.: 14/951,959

(22) Filed: Nov. 25, 2015

(65) Prior Publication Data

US 2016/0161930 A1 Jun. 9, 2016

Related U.S. Application Data (60) Provisional application No. 62/086,811, filed on Dec. 3, 2014.

(51) Int. Cl.
*G05B 17/02* (2006.01)
*G05B 19/418* (2006.01)

(52) U.S. Cl.
CPC ......... *G05B 17/02* (2013.01); *G05B 19/4188* (2013.01); *Y02P 90/24* (2015.11)

(58) Field of Classification Search
CPC .... G05B 17/02; G05B 19/4188; G05B 13/04; Y02P 90/24; G06F 17/5009; C09B 9/00; G09B 19/003
See application file for complete search history.

(56) References Cited

U.S. PATENT DOCUMENTS

| 6,795,798 | B2 * | 9/2004 | Eryurek | G05B 23/0254 |
| | | | | 700/29 |
| 7,257,523 | B1 * | 8/2007 | Nixon | G05B 17/02 |
| | | | | 700/2 |

(Continued)

OTHER PUBLICATIONS

European Search Report for EP Application Serial No. 14004258.1, dated Jun. 9, 2016, 8 pages.

(Continued)

*Primary Examiner* — Bitew A Dinke
(74) *Attorney, Agent, or Firm* — Amin, Turocy & Watson, LLP (57) ABSTRACT

A computer-implemented method for automatically exchanging data between a piping and instrumentation diagram (P&ID) and a control system comprises: parsing a P&ID and identifying instruments and/or groups of instruments within the P&ID, identifying one or more input tags and output tags associated with each identified instrument and/or with each identified group of instruments within the P&ID, and establishing at least one relationship among the one or more input tags and output tags, wherein the input tags and output tags for an instrument and/or a group of instruments and the at least one relationship between the corresponding input tags and output tags are derivable from a template library, and identifying a control loop for each established relationship among the input tags and the output tags, wherein said control loop is for controlling one or more instruments by the control system.

20 Claims, 6 Drawing Sheets

(56) References Cited

U.S. PATENT DOCUMENTS

| | | | | |
|---|---|---|---|---|
| 2007/0139441 | A1* | 6/2007 | Lucas | G05B 19/0426 345/619 |
| 2009/0282067 | A1* | 11/2009 | Bendigeri | G05B 19/042 |
| 2010/0042376 | A1* | 2/2010 | Weatherhead | G05B 19/409 703/1 |
| 2010/0315416 | A1* | 12/2010 | Pretlove | G06T 7/001 345/419 |
| 2011/0276160 | A1* | 11/2011 | Kelly | G06Q 10/067 700/100 |
| 2013/0124175 | A1* | 5/2013 | McKim | G09B 9/00 703/6 |
| 2013/0232186 | A1* | 9/2013 | Ingram | G05B 19/409 709/203 |
| 2013/0235041 | A1* | 9/2013 | Bierweiler | G05B 23/0251 345/440 |
| 2014/0089342 | A1* | 3/2014 | Takayanagi | G06F 17/30569 707/769 |
| 2014/0303754 | A1* | 10/2014 | Nixon | G05B 23/0267 700/83 |
| 2015/0012118 | A1* | 1/2015 | G | G05B 19/0426 700/17 |
| 2015/0178422 | A1* | 6/2015 | McKim | G09B 9/00 703/6 |
| 2015/0261215 | A1* | 9/2015 | Blevins | G05B 19/4184 700/17 |
| 2016/0109875 | A1* | 4/2016 | Majewski | G06F 21/6218 700/98 |

OTHER PUBLICATIONS

Howie, C., et al., "Computer Interpretation of Process and Instrumentation Drawings," Center for Integrated Facility Engineering, Feb. 1995, http://cife.stanford.edu/sites/default/files/WP037.pdf, retrieved May 31, 2016, 18 pages.

European Office Action for EP Application Serial No. 14004258.1, dated Jul. 18, 2016, 2 pages.

* cited by examiner

P AND ID AND CONTROL SYSTEM SYNCHRONIZATION

CROSS-REFERENCE TO RELATED APPLICATIONS

This application claims priority to U.S. Provisional Application Ser. No. 62/086,811, filed on Dec. 3, 2014, entitled "P&ID AND CONTROL SYSTEM SYNCHRONIZATION," the entirety of which is incorporated herein by reference.

BACKGROUND

The subject matter disclosed herein relates generally to industrial control systems, and, for example, to information exchange and synchronization between control system and P&ID drawings.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a method is provided, comprising parsing, by a system comprising at least one processor, a P&ID and identifying at least one instrument or group of instruments within the P&ID based on the parsing; identifying, by the system, one or more input tags and one or more output tags associated with each of the at least one instrument or group of instruments; establishing, by the system, at least one relationship between the one or more input tags and the one or more output tags, wherein the one or more input tags and the one or more output tags for the at least one instrument or group of instruments and the at least one relationship between the one or more input tags and the one or more output tags are derivable from a template library; and identifying, by the system, a control loop for the at least one relationship between the one or more input tags and the one or more output tags, wherein the control loop is configured to control one or more instruments in response to execution by the control system.

Also, one or more embodiments provide a non-transitory computer-readable medium having stored thereon computer-executable instructions that, in response to execution, cause a computing system to perform operations, the operations comprising parsing a piping and instrumentation diagram (P&ID); identifying, based on the parsing, an instrument or a group of instruments within the P&ID; identifying one or more input tags and one or more output tags associated with the instrument or the group of instruments; determining at least one relationship between the one or more input tags and the one or more output tags, wherein the one or more input tags and the one or more output tags for the instrument or the group of instruments and the at least one relationship between the one or more input tags and the one or more output tags are derivable from a template library; and identifying a control loop for the at least one relationship between the one or more input tags and the one or more output tags, wherein the control loop is configured to control one or more instruments in response to execution by a control system.

Also, according to one or more embodiments, a system for exchanging data between a piping and instrumentation diagram (P&ID) and a control system is provided, comprising a P&ID integration tool configured to identify instruments or groups of instruments based on analysis of a P&ID and to identify one or more input tags and one or more output tags associated with each of the instruments or groups of instruments; and a transformation engine configured to determine, based on a template library, one or more input tags and one or more output tags associated with each of the instruments or groups of instruments and one or more relationships between the one or more input tags and the one or more output tags, and identify a control loop for each of the one or more relationships, wherein the control loop is configured to facilitate control of one or more instruments in response to execution by the control system, wherein the P&ID integration tool is configured to output the control loop.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Industrial controllers and their associated I/O devices are central to the operation of modem automation systems. These controllers interact with field devices on the plant floor to control automated processes relating to such objectives as product manufacture, material handling, batch processing, supervisory control, and other such applications. Industrial controllers store and execute user-defined control programs to effect decision-making in connection with the controlled process. Such programs can include, but are not limited to, ladder logic, sequential function charts, function block diagrams, structured text, or other such platforms.

When designing processes in industrial environments, such as in factories or power plants, piping and instrumentation diagrams (P&ID) are often used as diagrams to illustrate the piping of process flow together with the installed equipment and instrumentation. Typically, P&ID drawings are provided to control engineers in the form of a print out, or in the form of a PDF-file or an image file. The P&ID drawings often include standardized symbols and numbers for pipes, signal lines, instruments, and groups of instruments.

At a later stage of the factory designing process, a control engineer may design a control system of the industrial environment based on the P&ID drawing. Typically, the control system designer or control system engineer must read the P&ID and determine or create a control loop for each instrument and/or group of instruments depicted in the P&ID to integrate the P&ID information into the control system. This process is not only time consuming, but also error prone. Moreover, different system designers or system engineers may create different control systems across varying applications.

To address these and other issues, one or more embodiments described herein provide a computer implemented method for automatic data extraction, transformation, and exchange between a piping and instrumentation diagram (P&ID) and a control system. The method comprises: parsing a P&ID and identifying instruments and/or groups of instruments within the P&ID, identifying one or more input tags and output tags associated with each identified instrument and/or with each identified group of instruments within the P&ID, and establishing at least one relationship among the one or more input tags and output tags, wherein the input tags and output tags for an instrument and/or a group of instruments and the at least one relationship between the corresponding input tags and output tags may be derivable from a template library, and identifying a control loop (type) for each established relationship among the input tags and the output tags, wherein said control loop is for controlling one or more instruments by the control system.

In one or more embodiments, the P&ID may be expressed in a markup language or any other machine-readable format.

Also, in one or more embodiments, the template library can comprise a plurality of templates, where each template is associated with at least one instrument and/or with at least one group of instruments, and wherein a template is a pre-defined part of an integration tool and defines at least one of one or more input tags, one or more output tags, and one or more relationships between input tags and output tags for an instrument and/or a group of instruments.

The method can further comprise identifying at least one of the templates for each instrument and/or for each group of instruments in one or more embodiments.

Also, in some embodiments, each of the plurality of templates may further comprise a source code template according to a control loop for an instrument or a group of instruments.

Also, the input tags can relate to data that is to be input to an instrument and output tags can relate to data that is output by an instrument in one or more embodiments.

In some embodiments, the computer-implemented method can further comprise finalizing the identified control loops, and distributing the finalized control loops to control modules within an industrial environment.

As noted above, Piping and Instrumentation Diagrams (P&ID) are often used in industrial environments to illustrate and organize instruments used in the environment, such as containers, apparatuses, pumps, heat exchangers, pipes, gauges, valves and so on.

Figure 1:
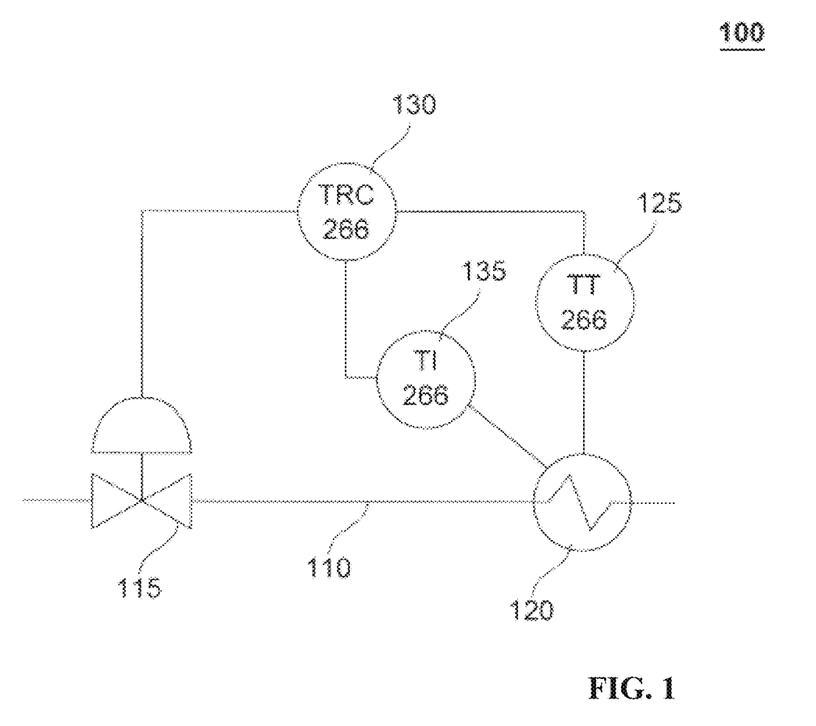
FIG. 1 is an example P&ID that illustrates a pipe which goes through a control valve and a heat exchanger.

FIG. 1 is an example of a simple P&ID 100 that illustrates a pipe which goes through a control valve 115 and a heat exchanger 120. The example P&ID 100 is for illustrative purposes only and does not necessarily describe a real world process. The example P&ID 100 illustrates the basic concept of how P&IDs may look and what kind of example information may be received from such a P&ID by one or more embodiments of the system described herein.

As can be seen in FIG. 1, the heat exchanger 120 is controlled by a temperature transmitter 125, indicated by the standardized tag with the letters "TT," and by a temperature recording controller 130, indicated by the standardized tag with the letters "TRC." The TRC 130 receives information about the temperature within the heat exchanger 120 via the temperature indicator "TI" 135, which is coupled to the heat exchanger 120. Based on the information from the TRC 130 and the TI 135, the control valve 115 is controlled to provide a high or low flow volume through the heat exchanger 120. The lower numbers in the circles of the TRC 130, the TT 125, and the TI 135 denote a loop number of these instruments. In this example, the loop number of this heat exchanging process is 266, but could be any value preferred by a system designer. Conventionally, when two or more instruments have the same loop number, they refer to the same loop for one process or sub-process. When a control system engineer creates a control system from the example P&ID 100 of FIG. 1, the control system designer typically enters information from the P&ID 100 again manually during the control system design, which leads to unnecessary spent time, possible errors, etc.

The control system engineer then must determine corresponding input tags and output tags for control for each instrument and/or for each group of instruments in the P&ID. These input tags and output tags for control specify what data is to be input to an instrument (or group of instruments) and what data is output by an instrument (or group of instruments). When the control system engineer creates the control loops for each of the instruments, the control system engineer must be aware of the available and/or necessary inputs and outputs for each instrument and also needs to know the relationship between the different input tags and output tags. According to the example P&ID of FIG. 1, for example, the temperature recording controller 130 may have at least one output tag and at least two input tags for control. The first input tag of the TRC 130 may specify an electrical signal to be received from the temperature indicator 135 which defines a temperature range the TI 135 may measure at the heat exchanger 120 during use. The second input tag for the TRC 130 may specify an electrical signal to be transmitted from the temperature transmitter 125, which defines a temperature the TT 125 currently applies to the heat exchanger 120 during use. The output tag for the TRC 130 may specify an electrical signal to be transmitted to the control valve 115, which defines a flow volume the control valve 115 has to pass through the pipe 110 during use. The different input tags and output tags of the different instruments may have a relationship to each other, which is to be specified by the control system designer when programming the control loops for the industrial environment.

Since a control system engineer may not be aware of all necessary input tags and output tags of control and their relationships among them for each instrument, the control system engineer may look up this information in specific databases, specifications, or manuals for instruments. After manually entering all data from the P&ID and after determining all input tags and output tags for control and their relationships, the control system engineer may then start programming the control loops and control sequences for the industrial environment comprising the different instruments from the P&ID.

Figure 2:
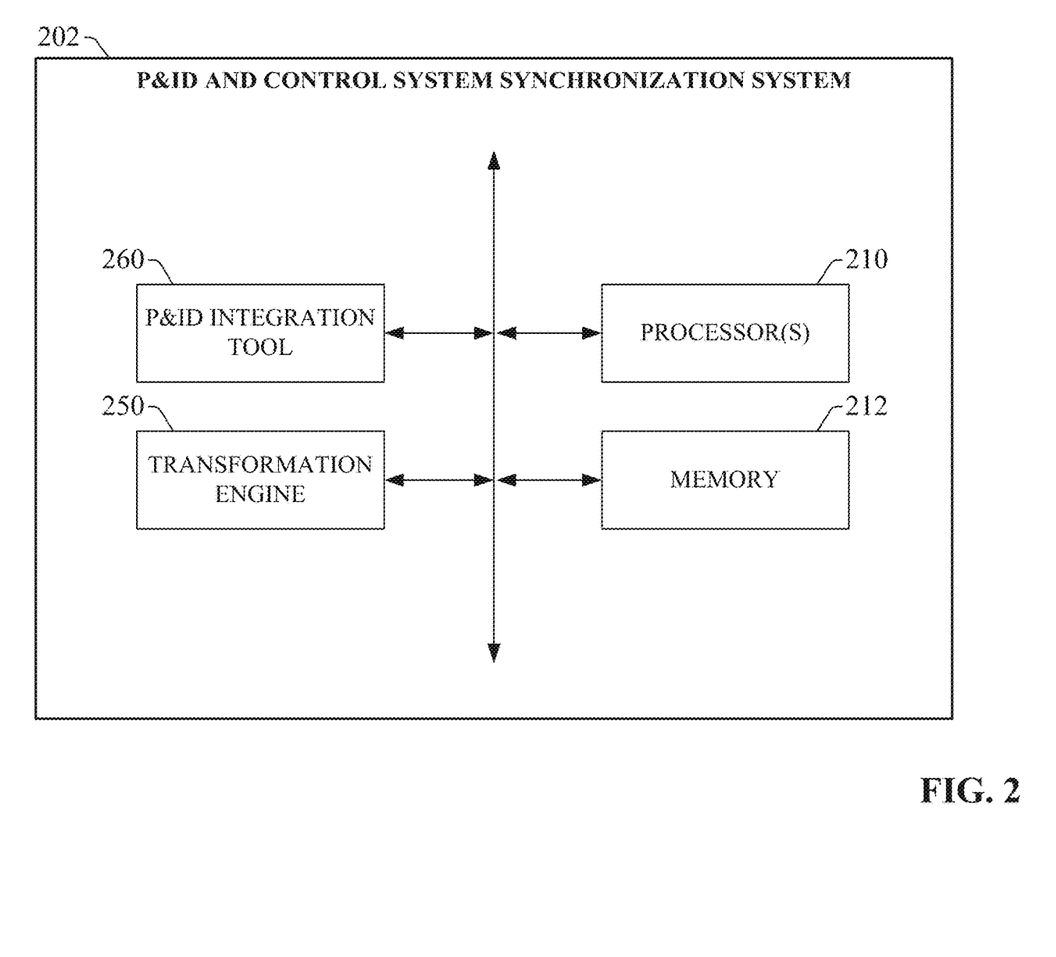
FIG. 2 is a diagram of an example P&ID and control system synchronization system.

FIG. 2 is a block diagram of an example P&ID and control system synchronization system 202 designed to substantially automate portions of the process described above. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

P&ID and control system synchronization system 202 can include a P&ID integration tool 260, a transformation engine 250, one or more processors 210, and memory 212. In various embodiments, one or more of the P&ID integration tool 260, transformation engine 250, the one or more processors 210, and memory 212 can be electrically and/or communicatively coupled to one another to perform one or more of the functions of the P&ID and control system synchronization system 202. In some embodiments, one or more of components 260 and 250 can comprise software instructions stored on memory 212 and executed by processor(s) 210. P&ID and control system synchronization system 202 may also interact with other hardware and/or software components not depicted in FIG. 2. For example, processor(s) 210 may interact with one or more external user interface devices, such as a keyboard, a mouse, a display monitor, a touchscreen, or other such interface devices.

P&ID integration tool 260 can be configured to receive data extracted from a P&ID and output control loops (or control loop types) for application to a control system of an industrial environment. Transformation engine 250 can be configured to transform the extracted information into bundles of determined I/O tags and their relationships, and to create an instance for each bundle of I/O tags and relationships.

The one or more processors 210 can perform one or more of the functions described herein with reference to the systems and/or methods disclosed. Memory 212 can be a computer-readable storage medium storing computer-executable instructions and/or information for performing the functions described herein with reference to the systems and/or methods disclosed.

Figure 3:
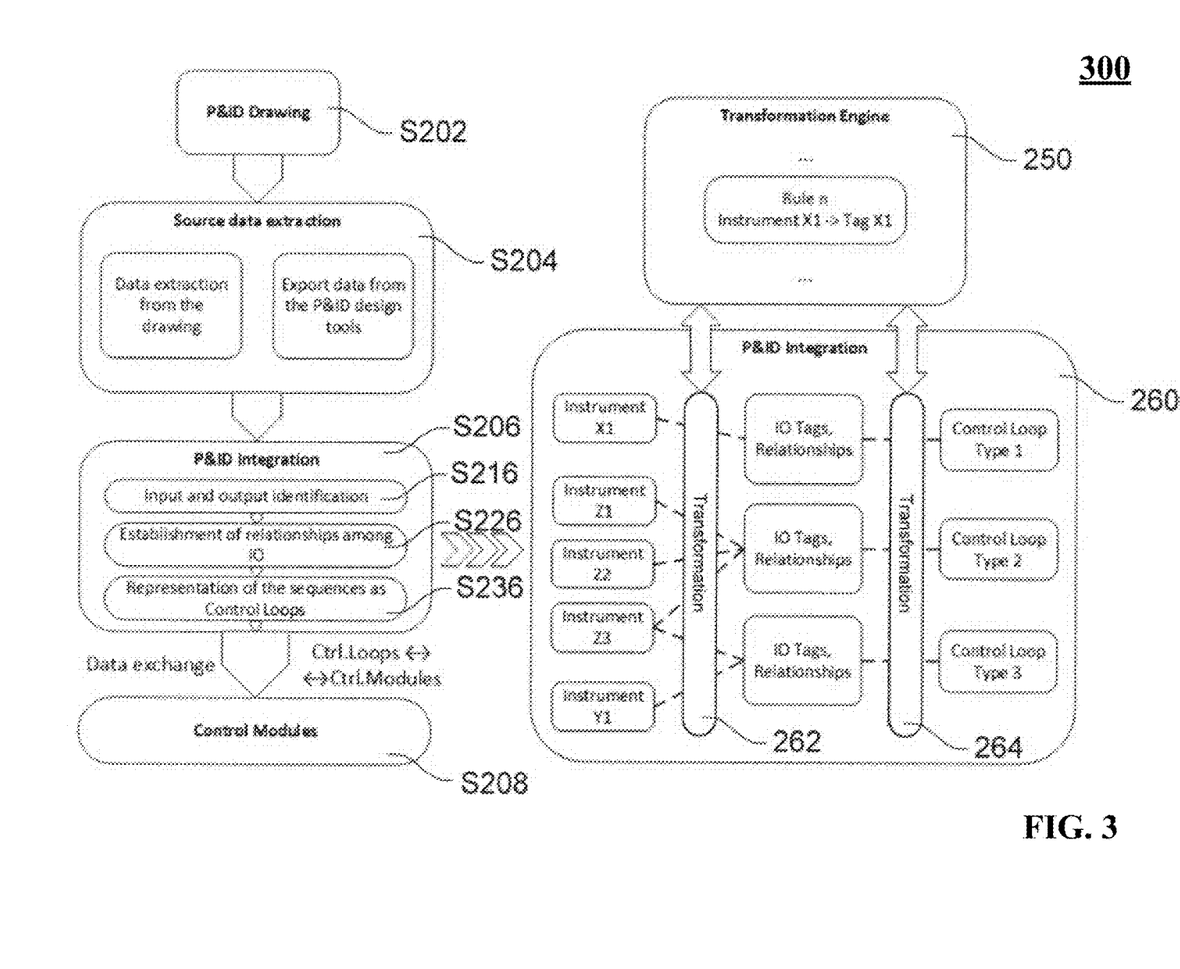
FIG. 3 is a diagram of a process for automatically exchanging data between a P&ID and a control system.

FIG. 3 is a diagram 300 for improving the above process according to one or more embodiments of the present disclosure. In some embodiments, the described process 300 of FIG. 3 may be performed by a computing system. Also, in some embodiments, at least the steps S204, S206, and S208 may be performed by a P&ID integration tool 260. In various embodiments, one or more of the steps described in connection with FIG. 3 below may be performed automatically by the integration tool, or may be performed in connection with input provided by a user of the tool. For example, the integration tool may provide one or more interface displays that guide the user through the process by rendering selection options (e.g., a subset of available templates) and prompting the user to enter selection and/or confirmation input that initiates execution of one or more of the described steps in accordance with the user's input.

In an initial step, the P&ID drawing is created or otherwise acquired at step S202. For example, the P&ID drawing may be created with a software application. In one or more embodiments, the P&ID may be expressed in a machine-readable form, e.g. a markup language, such as extensible markup language (XML) or XMpLant (based on ISO 15926). These formats allow extracting of information about P&ID instruments and their attributes, and information about loops as well. However, the invention is not limited to a specific format of the P&ID, and other P&ID formats are also within the scope of one or more embodiments described herein. Also, printouts of P&IDs or P&IDs as PDF files may be used in one or more embodiments. In such embodiments, the system may be configured to perform processing on the printouts or PDF files, such as text recognition or pattern recognition, in order to electronically extract information from the P&ID printout or PDF.

In step S204, the P&ID is received by a source data extraction tool. In various embodiments, the source data extraction tool may be a standalone application on the computing system or may be part of the P&ID integration tool 260. In other embodiments, step S204 may be performed by a P&ID design tool itself. However, embodiments of the invention are not limited to these execution options. When the source data extraction tool receives the P&ID, it starts extracting data from the P&ID. This may comprise parsing the P&ID to identify instruments and/or groups of instruments within the P&ID. As mentioned above, the received P&ID may be in XML format in one or more embodiments, or may be a P&ID drawing which is further processed in order to extract data therefrom. Data extracted from the P&ID may include, but is not limited to, a list of instruments and their relationships to each other. After the data extraction from the P&ID, the source data extraction tool may start exporting the extracted data from the P&ID to the P&ID integration tool 260.

In step S206, the P&ID integration tool 260 receives the extracted data from the P&ID and outputs at its end control loops (or control loops of certain types) for application to the control system of the industrial environment. In more detail, in sub-steps S216 and S226, the P&ID integration tool 260 identifies instruments within the P&ID and determines the input tags and output tags for control and the relationships among them. As can be seen on the right side of FIG. 3, which illustrates a more detailed view of the P&ID integration tool, a first transformation 262 transforms the extracted information (e.g. the list of instruments within the P&ID) into bundles of determined I/O tags and their relationships.

According to one or more embodiments, this first transformation 262 is based on instructions acquired from a transformation engine 250. The transformation engine 250 may be a rule-based engine or module that stores a plurality of templates which are applied to the extracted data from the P&ID, such as an instruments list, based on rules for each instrument and/or for each group of instruments. The transformation engine 250 may therefore include a template library, which stores a plurality of pre-defined parts and design patterns of control systems (e.g. as templates) and further stores rules dictating how to select an appropriate template and how to apply the template. The rules may be established by a domain expert.

In general, the transformation engine stores and leverages simple or more complex rules regarding how to transform certain instruments (or instrument groups) into corresponding I/O tags, how to transform the I/O tags into corresponding relationships, and how to transform the relationships into the control loops of certain types. In addition to these rules, the transformation engine may use a template from the template library to effect the transformations. A selected template may be applicable on an instrument (or group of instruments), and/or on the I/O tags and their relationships. The template represents an overall control loop or a part of a control loop and may involve a source code template for a control system. The template library may represent extensible manufacturing functions as higher level building blocks, which may be used as templates for the control system design. The templates can thus transform instruments directly into control loops.

As can be seen in the example case in FIG. 3, an instrument X1 may be identified by the transformation engine 250 to relate to "Rule n." This "Rule n" for instrument X1 may define that "Tag X1" refers to instrument X1. The "Tag X1" refers to one or more I/O tags for control and their relationships among them. However, in some embodiments, the relationships between I/O tags may be specified by different rules. For example: "rule n: instrument X is represented by tag Y" and "rule m: the tags Y, Z in instrument X have a certain relationship . . . "). Likewise, the transformation engine 250 may also comprise and identify rules for groups of instruments. For example, the transformation engine 250 may identify a rule for the combination of instruments Z1, Z2, and Z3 as specified in the P&ID. The identified rule for such a group may refer to a template for this group of instruments. When this template is then applied, one set of I/O tags for control and their relationships among them is provided.

When all necessary I/O tags for control and the corresponding relationships among them are identified, at step S236 the P&ID integration tool 260 applies the second transformation 264 in order to create an instance for each bundle of I/O tags and relationships. The second transformation 264 may be a template corresponding to the identified I/O tags and relationships and provides one or more identified control loop types.

Although the P&ID integration step has been described above as applying two different transformations, embodiments described herein are not limited to two transformations (i.e. to two templates). In one or more embodiments, the rule-based transformation engine 250 can comprise rules that identify one template suitable for an instrument (or for a group of instruments), wherein the template specifies all I/O tags and the relationships among them, and the template further defines an appropriate control loop for the instruments. In other words, the process in the P&ID integration tool 260 may be divided into three steps:

1. I/O tag identification;
2. Establishment of relationships among I/O tags; and
3. Representation of the outcomes from steps 1 and 2 as instances of one or more control loop types.

These three steps or stages can be performed by the P&ID integration tool 260 concurrently by identifying the appropriate rule (i.e. the appropriate template from the template database) for the identified instruments or may be divided into two transformations (i.e. applying two templates), as shown in FIG. 3. However, the general concept of the invention is not limited to one of these options, and additional steps and/or sub-steps may be present in the procedure without departing from the scope of one or more embodiments of this disclosure.

The obtained control loops represent programming constructs (e.g. source code), which may then be used by the control system engineer to finalize the control system. For example, the control system engineer may then define or add in appropriate parameters for each control loop. However, in some embodiments, the parameters for the control system may already be extracted from the P&ID drawings or additional P&ID information, or their insertion may be guided by the user interface of the integration tool 260, and may be inserted into the template control loop automatically by the P&ID integration tool 260.

In step S208, the control loops may then be distributed to control modules within the industrial environment, where the control loops can be used to appropriately control the machines and instruments within the industrial environment and in accordance with the P&ID. This step may include linking instances of control loop types to industrial controllers. In some embodiments, the steps S208 and S204 may also be performed by the P&ID integration tool 260. However, the invention is not limited to one entity performing all of the described steps.

Figure 4:
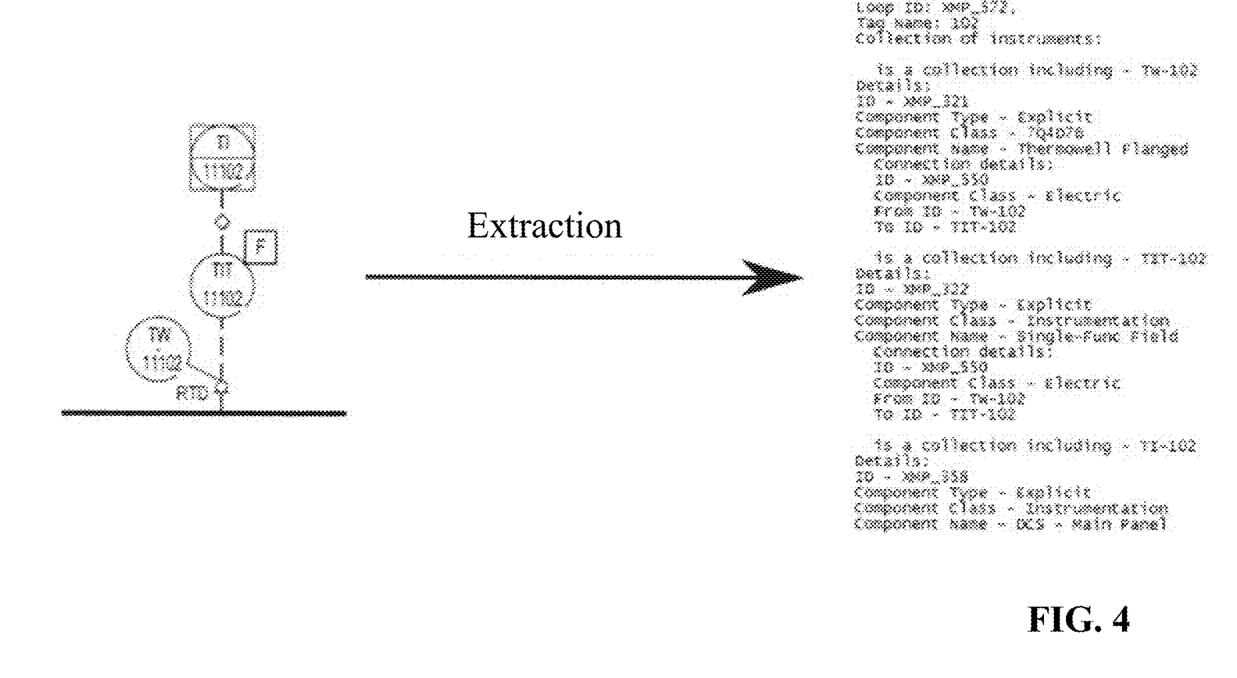
FIG. 4 illustrates extraction of information from a P&ID expressed in an XML format into a textual overview of the P&ID structure relevant to a control system.

FIG. 4 illustrates an example of extracted information from a P&ID expressed in XML format into a human-readable form showing information necessary for the corresponding control system. As can be seen, the instruments TI-102, TIT-102, and TW-102 are present in the XML output, and the connections between them are derivable from, or directly stated in, the XML. The example shown in FIG. 4 is only an excerpt of human-readable information of the XML file. The original XML file may comprise more details.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 5:
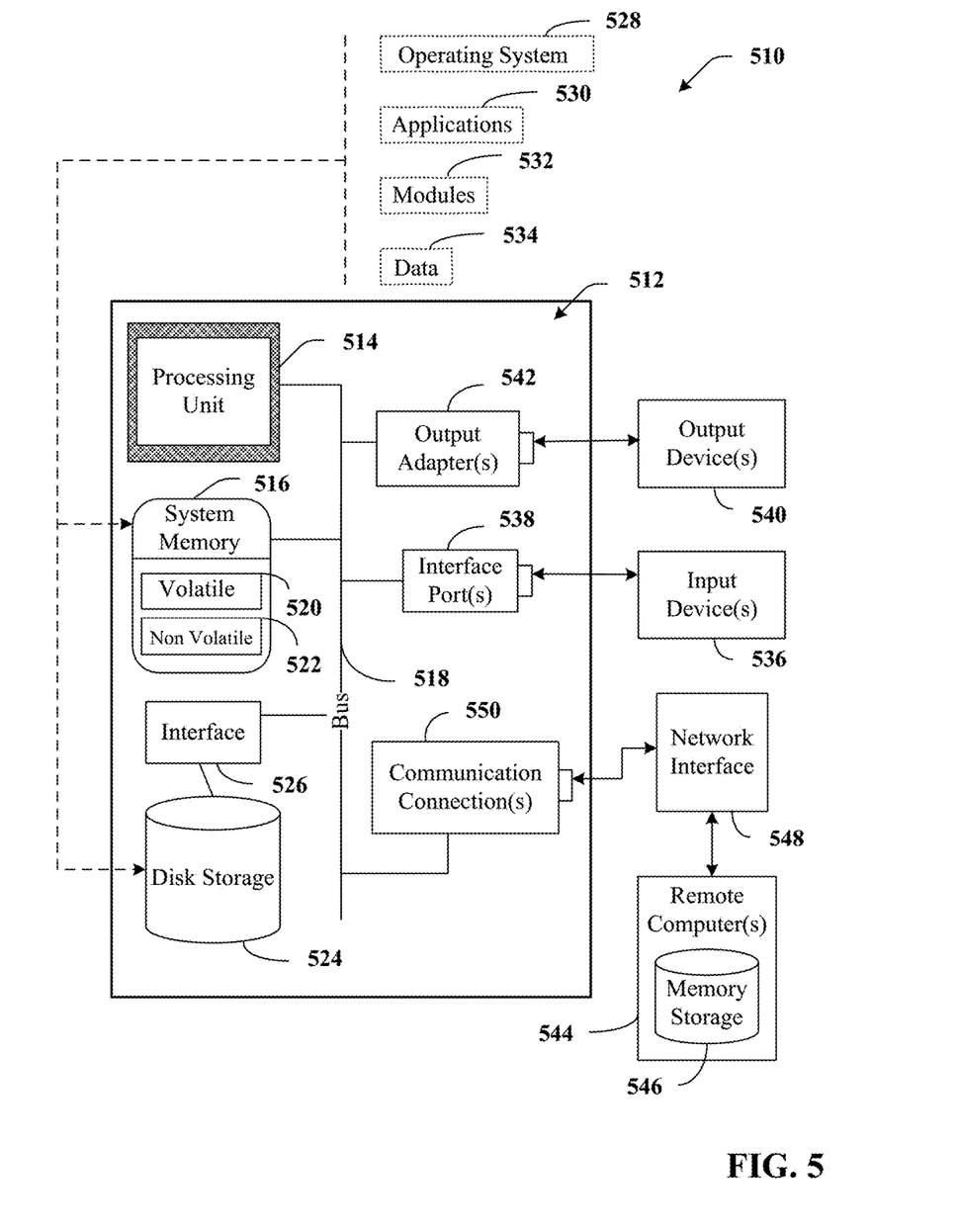
FIG. 5 is an example computing environment.
Figure 6:
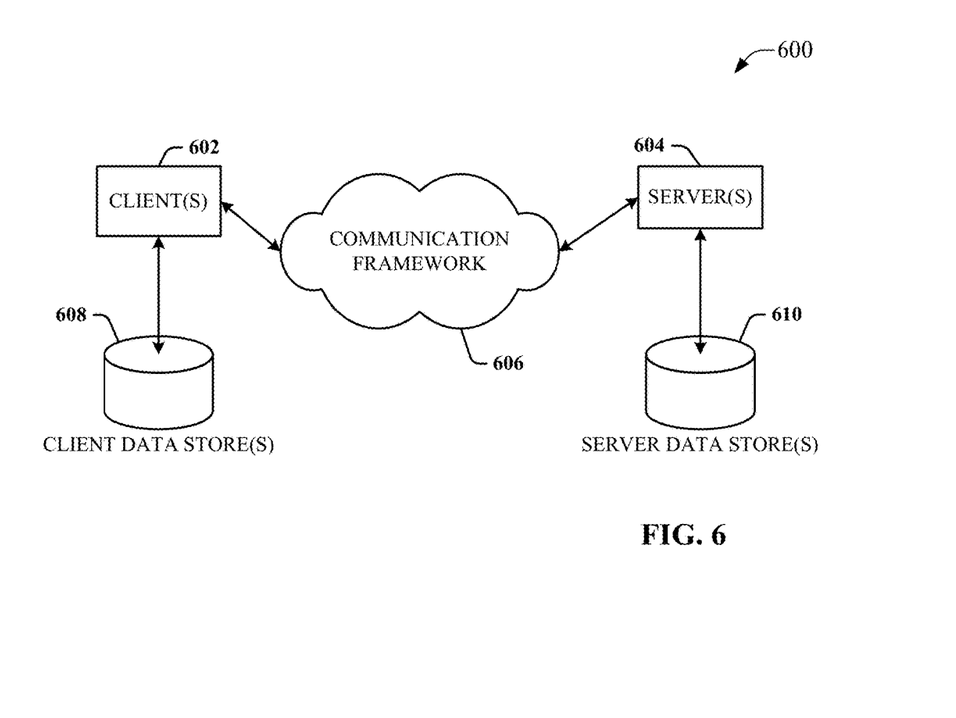
FIG. 6 is an example networking environment.

In order to provide a context for the various aspects of the disclosed subject matter, FIGS. 5 and 6 as well as the following discussion are intended to provide a brief, general description of a suitable environment in which the various aspects of the disclosed subject matter may be implemented.

With reference to FIG. 5, an example environment 510 for implementing various aspects of the aforementioned subject matter includes a computer 512. The computer 512 includes a processing unit 514, a system memory 516, and a system bus 518. The system bus 518 couples system components including, but not limited to, the system memory 516 to the processing unit 514. The processing unit 514 can be any of various available processors. Multi-core microprocessors and other multiprocessor architectures also can be employed as the processing unit 514.

The system bus 518 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 516 includes volatile memory 520 and nonvolatile memory 522. The basic input/output system (BIOS), containing the basic routines to transfer information between elements within the computer 512, such as during start-up, is stored in nonvolatile memory 522. By way of illustration, and not limitation, nonvolatile memory 522 can include read only memory (ROM), programmable ROM (PROM), electrically programmable ROM (EPROM), electrically erasable PROM (EEPROM), or flash memory. Volatile memory 520 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 512 also includes removable/non-removable, volatile/nonvolatile computer storage media. FIG. 5 illustrates, for example a disk storage 524. Disk storage 524 includes, but is not limited to, devices like a magnetic disk drive, floppy disk drive, tape drive, Jaz drive, Zip drive, LS-100 drive, flash memory card, or memory stick. In addition, disk storage 524 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 524 to the system bus 518, a removable or non-removable interface is typically used such as interface 526.

It is to be appreciated that FIG. 5 describes software that acts as an intermediary between users and the basic computer resources described in suitable operating environment 510. Such software includes an operating system 528. Operating system 528, which can be stored on disk storage 524, acts to control and allocate resources of the computer 512. System applications 530 take advantage of the management of resources by operating system 528 through program modules 532 and program data 1234 stored either in system memory 516 or on disk storage 524. It is to be appreciated that one or more embodiments of the subject disclosure can be implemented with various operating systems or combinations of operating systems.

A user enters commands or information into the computer 512 through input device(s) 536. Input devices 536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 514 through the system bus 518 via interface port(s) 538. Interface port(s) 538 include, for example, a serial port, a parallel port, a game port, and a universal serial bus (USB). Output device(s) 540 use some of the same type of ports as input device(s) 536. Thus, for example, a USB port may be used to provide input to computer 512, and to output information from computer 512 to an output device 540. Output adapters 542 are provided to illustrate that there are some output devices 540 like monitors, speakers, and printers, among other output devices 540, which require special adapters. The output adapters 542 include, by way of illustration and not limitation, video and sound cards that provide a means of connection between the output device 540 and the system bus 518. It should be noted that other devices and/or systems of devices provide both input and output capabilities such as remote computer(s) 544.

Computer 512 can operate in a networked environment using logical connections to one or more remote computers, such as remote computer(s) 544. The remote computer(s) 544 can be a personal computer, a server, a router, a network PC, a workstation, a microprocessor based appliance, a peer device or other common network node and the like, and typically includes many or all of the elements described relative to computer 512. For purposes of brevity, only a memory storage device 546 is illustrated with remote computer(s) 544. Remote computer(s) 544 is logically connected to computer 512 through a network interface 548 and then physically connected via communication connection 550. Network interface 548 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 550 refers to the hardware/software employed to connect the network interface 548 to the system bus 518. While communication connection 550 is shown for illustrative clarity inside computer 512, it can also be external to computer 512. The hardware/software necessary for connection to the network interface 548 includes, for exemplary purposes only, internal and external technologies such as, modems including regular telephone grade modems, cable modems and DSL modems, ISDN adapters, and Ethernet cards.

FIG. 6 is a schematic block diagram of a sample computing environment 600 with which the disclosed subject matter can interact. The sample computing environment 600 includes one or more client(s) 602. The client(s) 602 can be hardware and/or software (e.g., threads, processes, computing devices). The sample computing environment 600 also includes one or more server(s) 604. The server(s) 604 can also be hardware and/or software (e.g., threads, processes, computing devices). The servers 604 can house threads to perform transformations by employing one or more embodiments as described herein, for example. One possible communication between a client 602 and servers 604 can be in the form of a data packet adapted to be transmitted between two or more computer processes. The sample computing environment 600 includes a communication framework 606 that can be employed to facilitate communications between the client(s) 602 and the server(s) 604. The client(s) 602 are operably connected to one or more client data store(s) 608 that can be employed to store information local to the client(s) 602. Similarly, the server(s) 604 are operably connected to one or more server data store(s) 610 that can be employed to store information local to the servers 604.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A method for automatically exchanging data between a piping and instrumentation diagram (P&ID) and a control system, comprising:
   parsing, by a system comprising at least one processor, a P&ID and identifying instruments within the P&ID based on the parsing;
   identifying, by the system, a rule, of a set of rules maintained in a template library, corresponding to a group of instruments included in the instruments, wherein the rule defines input tags associated with the group of instruments, output tags associated with the group of instruments, and one or more relationships between the input tags and the output tags;
   identifying, by the system based on the rule, one or more input tags and one or more output tags associated with the group of instruments;
   determining, by the system based on the rule, at least one relationship between the one or more input tags and the one or more output tags;
   identifying, by the system, a control loop based on the at least one relationship between the one or more input tags and the one or more output tags, wherein the control loop is configured to control the instruments in response to execution by the control system;
   generating, by the system based on an identity of the control loop, executable source code that, in response to execution by the control system, causes the control system to control the instruments in accordance with the control loop; and
   sending, by the system, the executable source code to the control system.

2. The method of claim 1, wherein the P&ID is in a machine-readable format.

3. The method of claim 1, wherein each rule of the set of rules is associated with at least one instrument or at least one group of instruments, and each rule of the set of rules is a predefined part of an integration tool and defines one or more relationships between input tags and output tags for an instrument or a group of instruments.

4. The method of claim 3, wherein the generating the executable source code comprises generating the executable source code based on a source code template corresponding to one or more of the instruments.

5. The method of claim 1, wherein the one or more input tags relate to data that is to be input to an instrument of the group of instruments, and the one or more output tags relate to data that is to be output by an instrument of the group of instruments.

6. The method of claim 1, further comprising:
   finalizing the control loops based on received control loop parameters to yield finalized control loops; and
   distributing the executable source code representing the finalized control loops to one or more control modules within an industrial environment.

7. A non-transitory computer-readable medium having stored thereon computer-executable instructions that, in response to execution, cause a computing system to perform operations, the operations comprising:
   parsing a piping and instrumentation diagram (P&ID);
   identifying, based on the parsing, instruments within the P&ID;
   identifying a rule, of a set of rules maintained in a template library, corresponding to a group of instruments included in the instruments, wherein the rule defines input tags associated with the group of instruments, output tags associated with the group of instruments, and one or more relationships between the input tags and the output tags;
   identifying, based on the rule, the input tags and the output tags associated with the group of instruments;
   determining, based on the rule, a relationship between the input tags and the output tags;
   identifying a control loop based on the relationship between the input tags and the output tags, wherein the control loop is configured to control one or more instruments of the group of instruments, in response to execution by a control system;
   generating, based on an identity of the control loop, executable source code that, in response to execution by the control system, causes the control system to control the instruments in accordance with the control loop; and
   sending the executable source code to the control system.

8. The non-transitory computer-readable medium of claim 7, wherein the P&ID is expressed in a machine-readable form.

9. The non-transitory computer-readable medium of claim 7, wherein each rule of the set of rules is associated with at least one instrument or at least one group of instruments, and each rule is a predefined part of an integration tool and defines at least one of one or more input tags, one or more output tags, or one or more relationships between input tags and output tags for an instrument or a group of instruments.

10. The non-transitory computer-readable medium of claim 9, wherein the generating the executable source code comprises generating the executable source code based on a source code template associated with the control loop.

11. The non-transitory computer-readable medium of claim 7, wherein the input tags relate to data that is to be input to at least one instrument of the group of instruments, and the output tags relate to data that is to be output by at least one instrument of the group of instrument.

12. The non-transitory computer-readable medium of claim 7, wherein the operations further comprise:
  finalizing the control loop based on received control loop parameter values to yield finalized executable source code; and
  distributing the finalized executable source code to one or more control modules within an industrial environment.

13. A system for exchanging data between a piping and instrumentation diagram (P&ID) and a control system, comprising:
  a memory that stores executable components; and
  a processor, operatively coupled to the memory, that executes the executable components, the executable components comprising:
    a P&ID integration tool configured to identify instruments associated with the P&ID based on analysis of the P&ID; and
    a transformation engine configured to:
      identify a rule, from a set of rules maintained in a template library, corresponding to a group of instruments included in the instruments identified by the P&ID integration tool, wherein the rule defines input tags associated with the group of instruments, output tags associated with the group of instruments, and one or more relationships between the input tags and the output tags,
      determine, based on identifications of the group of instruments and the rule, the input tags and the output tags associated with the group of instruments and the one or more relationships between the input tags and the output tags,
      identify a template corresponding to the input tags, the output tags, and the one or more relationships,
      identify a control loop defined by the template for each of the one or more relationships, wherein the control loop is configured to facilitate control of the instruments in response to execution by the control system, and
      generate, based on an identity of the control loop, executable source code that, in response to execution by a control system, causes the control system to control the instruments in accordance with the control loop,
    wherein the P&ID integration tool is configured to output executable source code for the control loop to the control system.

14. The system of claim 13, wherein the P&ID comprises at least one of a machine-readable P&ID or a human-readable drawing, and the P&ID integration tool is further configured to:
  extract data from the P&ID to yield extracted data, and
  parse the extracted data to identify the instruments.

15. The system of claim 13, wherein the transformation engine is configured to generate the source code based on a source code template corresponding to the group of instruments.

16. The system of claim 13, wherein the input tags correspond to data that is to be input to one or more of the group of instruments, and the output tags correspond to data that is to be output by one or more of the group of instruments.

17. The system of claim 13, wherein each rule of the set of rules corresponds to an instrument or to a combination of instruments.

18. The system of claim 13, wherein the P&ID comprises a drawing printout, and the P&ID integration tool is further configured to:
  extract data from the P&ID based on at least one of text recognition or pattern recognition to yield extracted data, and
  parse the extracted data to identify the instruments.

19. The system of claim 13, wherein the transformation engine is further configured to:
  receive parameter values for the control loop,
  update the control loop based on the parameter values to yield finalized executable source code, and
  distribute the finalized executable source code to the control system.

20. The system of claim 19, wherein the parameter values are at least one of received via a user interface generated by the system or extracted from the P&ID.

* * * * *